(12) United States Patent
Braceras et al.

(10) Patent No.: US 10,978,143 B2
(45) Date of Patent: Apr. 13, 2021

(54) MULTI-PORT HIGH PERFORMANCE MEMORY

(71) Applicant: MARVELL INTERNATIONAL LTD., Hamilton (BM)

(72) Inventors: George M. Braceras, Essex Junction, VT (US); Xiaoli Hu, Shanghai (CN); Wei Zhao, Shanghai (CN); Igor Arsovski, Williston, VT (US); Yuzheng Jin, Shanghai (CN); Hao Pu, Shanghai (CN); Shuangdi Zhao, Shanghai (CN); Qing Li, Shanghai (CN)

(73) Assignee: Marvell Asia Pte, Ltd., Singapore (SG)

( * ) Notice: Subject to any disclaimer, the term of this patent is extended or adjusted under 35 U.S.C. 154(b) by 0 days.

(21) Appl. No.: 16/550,953

(22) Filed: Aug. 26, 2019

(65) Prior Publication Data
US 2021/0065784 A1    Mar. 4, 2021

(51) Int. Cl.
| G11C 11/00 | (2006.01) |
| G11C 11/419 | (2006.01) |
| G11C 11/412 | (2006.01) |
| G11C 11/417 | (2006.01) |

(52) U.S. Cl.
CPC .......... *G11C 11/419* (2013.01); *G11C 11/412* (2013.01); *G11C 11/417* (2013.01)

(58) Field of Classification Search
CPC .... G11C 11/419; G11C 11/412; G11C 11/417
See application file for complete search history.

(56) References Cited

U.S. PATENT DOCUMENTS

| 9,064,556 B2 * | 6/2015 | Gulati ................. G11C 11/419 |
| 9,384,825 B2 | 7/2016 | Lin et al. |
| 9,436,598 B2 * | 9/2016 | Tsuruda ............... G11C 16/225 |
| 9,627,022 B2 | 4/2017 | Chen et al. |
| 10,037,290 B1 * | 7/2018 | Lee ....................... G06F 15/167 |
| 2014/0063919 A1 | 3/2014 | Liaw |
| 2019/0096476 A1 * | 3/2019 | Chen ..................... G11C 7/1075 |

* cited by examiner

*Primary Examiner* — Pho M Luu

(57) ABSTRACT

A structure includes a multi-port memory including a multiple transistor bitcell single ended read port and a write port, a read circuit which is connected to a multiple transistor bitcell circuit and is also configured to evaluate the multiple transistor bitcell single ended read port, and a timer circuit for the single ended read port and which is configured to generate two successive read pulses in one clock cycle for the multi-port memory.

25 Claims, 8 Drawing Sheets

MULTI-PORT HIGH PERFORMANCE MEMORY

FIELD OF THE INVENTION

The present disclosure relates to a multi-port high performance memory circuit, and more particularly, to a circuit and a method for an eight transistor (8T) based high performance two or three read port (2R/3R) one write port (1W) memory circuit.

BACKGROUND

An eight transistor (8T) two-port bitcell is used for high performance artificial intelligence (AI) and machine learning (ML) hardware applications because of its fast read access. The eight transistor (8T) two-port bitcell is also used for low power applications because of its isolated read and write ports which make it immune to stability issues in a multiplexer design. Asynchronous read and write ports are also beneficial for high performance multi port applications.

Using domino logic on the eight transistor (8T) two-port bitcell allows for a fast read operation. In this scenario, the limits of the read port system frequency can be approximately 1.7 times the limits of the write port system frequency. Therefore, when using the one read one write (1R1W) memory with the eight transistor (8T) bitcell, there is an unbalanced read and write performance.

In most AI and ML hardware applications, the read port clock and write port clock are set at a same system frequency. Therefore, when using 1R1W memory with the 8T bitcell, the read port will not be able to run at its highest frequency because it is limited by the write port system frequency. Therefore, an improved multi-port high performance 8T bitcell based memory is needed to improve the memory performance.

SUMMARY

In an aspect of the disclosure, a structure includes a multi-port memory including a multiple bitcell single ended read port and a write port, a domino read circuit which is connected to a multiple bitcell circuit and is also configured to evaluate the multiple transistor bitcell single ended read port, and a double pump timer circuit in a circuit control block for the single ended read port and which is configured to generate two successive read pulses in one clock cycle for the multi-port memory.

In another aspect of the disclosure, a circuit includes a multi-port memory including a multiple transistor bitcell single ended read port and a write port, a domino read circuit which includes a plurality of transistors, and which is connected to a read bitline of the multi-port memory, and which is configured to evaluate the multiple transistor bitcell single ended read port, a first double pump timer circuit which is in a first circuit control block for the single ended read port and which is configured to generate two successive read pulses in one clock cycle, and a second double pump timer circuit which is in a second circuit control block for a differential port and which is configured to generate two timing pulses to enable a read operation followed by a write operation in the one clock cycle.

In another aspect of the disclosure, a method includes generating two successive read pulses in one clock cycle in a first double pump timer circuit of a memory circuit using a single ended domino read circuit, generating two timing pulses to enable a read operation followed by a write operation in the one clock cycle in a second double pump timer circuit of the memory circuit using a differential sense amplifier circuit, evaluating a multiple transistor bitcell single ended read port in the single ended domino read circuit of the memory circuit, and generating synchronized timing signals for output latches to enable a same access time for all read ports.

BRIEF DESCRIPTION OF THE DRAWINGS

The present disclosure is described in the detailed description which follows, in reference to the noted plurality of drawings by way of non-limiting examples of exemplary embodiments of the present disclosure.

DETAILED DESCRIPTION

The present disclosure relates to a multi-port high performance memory circuit, and more particularly, to a circuit and a method built around either a two read one write (2R1W) memory circuit built with an eight transistor (8T) bitcell or a three read one write (3R1W) memory circuit built with an eight transistor (8T) bitcell. Advantageously, by implementing the circuits disclosed herein, higher density static random access memory (SRAM) can be achieved, in comparison to a conventional 2R1W circuit (which uses a ten transistor bitcell) or a conventional 3R1W circuit (which uses a twelve transistor bitcell). Further, by implementing the circuits disclosed herein, a multi-port memory with asynchronous read and write operations can be achieved. Also, by implementing the circuits disclosed herein, high performance read and balanced read-write performance can be achieved.

In specific embodiments, the multi-port memory can provide a double pump domino read on the 8T bitcell single-ended read port. Further, the 8T bitcell enables a multi-ported SRAM to have two read ports by double pumping the single read port from an 8T two-port bitcell in a memory macro to double the data read bandwidth. The write port is on the 8T two-port bitcell's differential bitline port. In operation, the first read data is latched and sent to the output until a strobe signal of a second read occurs. Further, a clock synchronizer is used to synchronize the output latch of two read ports to have the same access time in both read ports.

In further embodiments, a differential sensing read occurs on the 8T two-port bitcell's differential bitline port to have a read operation followed by a write operation, also known as a time division multiplexed (TDM) technique. The 8T two-port bitcell has a differential sense amplifier on the 8T two port bitcell's differential bitline port. In operation, the read data is latched in a latch circuit and sent to the output until the strobe/PIPECLK signal of a second read occurs on the 8T read port. Further, a clock synchronizer is used to synchronize the output latch of two read ports to have the same access time in both read ports.

Figure 1A:
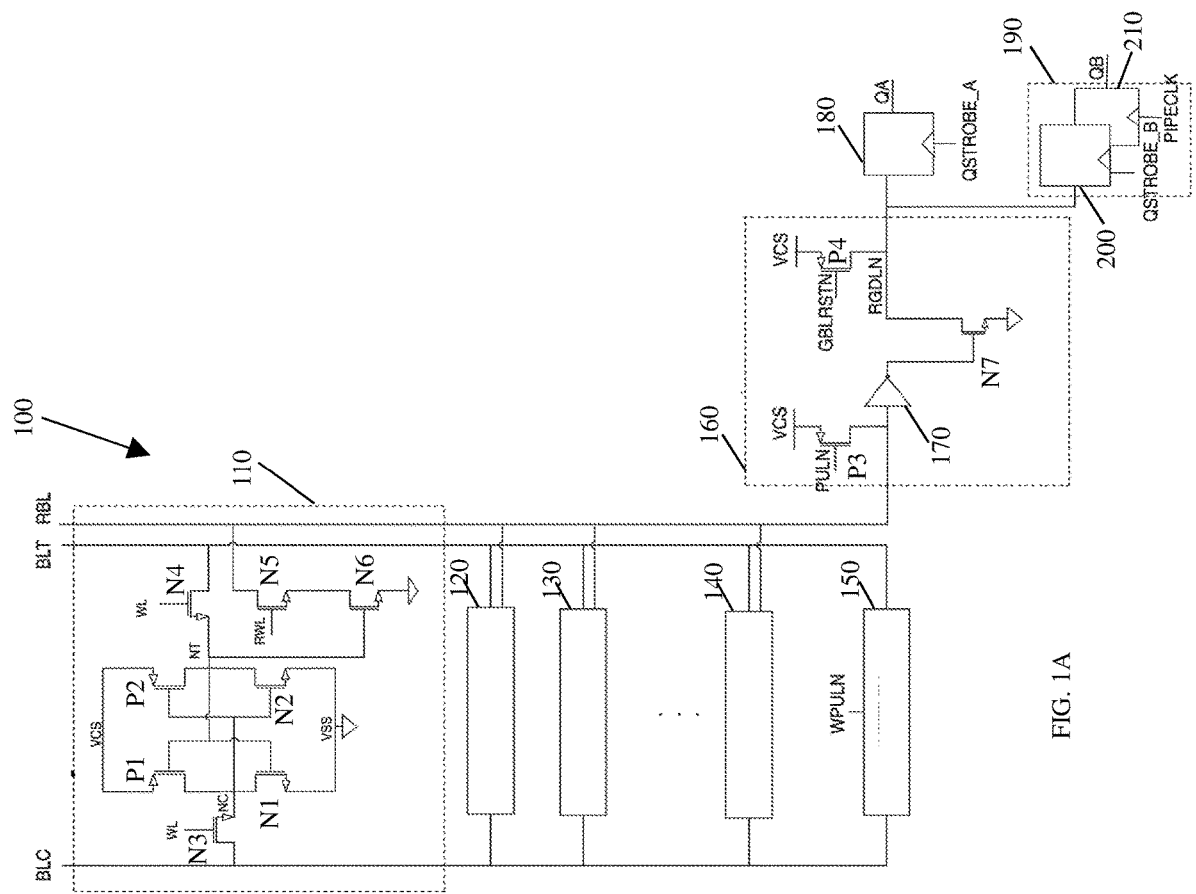
FIG. 1A shows an overview of a high performance (2R1W) memory circuit with an eight transistor (8T) bitcell with two read port and one write port in accordance with aspects of the present disclosure.

FIG. 1A shows an overview of a high performance (2R1W) memory circuit with an eight transistor (8T) bitcell with two read ports and one write port in accordance with aspects of the present disclosure. The memory circuit 100 of FIG. 1A includes a plurality of eight transistor (8T) bitcell circuits 110, 120, 130, 140 and 150, in addition to a domino read circuit 160 which is connected to the plurality of 8T bitcell circuits 110, 120, 130, 140, and 150. The memory circuit 100 further includes the latch 180 and the latch circuit 190. In embodiments, the eight transistor (8T) bitcell circuits 110, 120, 130, 140 and 150 can be any conventional eight transistor (8T) bitcell circuit, with bitcell circuit 150 being an Nth number circuit.

In embodiments, each of the eight transistor (8T) bitcell circuits 110, 120, 130, 140 and 150 includes, for example, a PMOS transistor P1 with a source connected to a first power supply VCS, a gate connected to a gate of a NMOS transistor N1, and a drain connected to a NC node. The 8T bitcell circuit 110 also includes a PMOS transistor P2 which has a source connected to the first power supply VCS, a gate connected to a gate of a NMOS transistor N2, and a drain connected to a NT node. The NMOS transistor N1 has a drain connected to the NC node and a source connected to a second power supply VSS (which can be ground). The NMOS transistor N2 has a drain connected to the NT node and a source connected to the second power supply VSS.

The 8T bitcell circuit 110 further includes a NMOS transistor N3 which has a drain connected to a complement bitline BLC, a gate connected to a write wordline WL, and a source connected to the NC node. The 8T bitcell circuit 110 also includes a NMOS transistor N4 which has a source connected to the NT node, a gate connected to the write wordline WL, and a drain connected to a true bitline BLT. A NMOS transistor N5 has a drain connected to a read bitline RBL, a gate connected to a read wordline RWL, and a source connected to a drain of a NMOS transistor N6. Lastly, a NMOS transistor N6 has a gate connected to the node NT and a source connected to the second power supply VSS. The true bitline BLT and the complement bitline BLC are the write bitlines and RBL is the read bitline which connects to the array.

The memory circuit 100 of FIG. 1A also includes the 8T bitcell 120, the 8T bitcell 130, . . . , and a N bitcell 140, where N is an integer number greater than 2. The 8T bitcell 120, the 8T bitcell 130, and the N bitcell 140 are each connected to the true bitcell BLT and the complement bitcell BLC. The memory circuit 100 includes a write driver 150 which is connected to the true bitcell BLT and the complement bitcell BLC, and receives a write driver pull up signal WPULN.

The domino read circuit 160 includes a PMOS transistor P3 with a source connected to the first power supply VCS, a gate connected to a pull up signal PULN, and a drain connected to an input of an inverter 170 of the domino read circuit 160. The inverter 170 receives the read bitline RBL and outputs an inverter output signal to a gate of a NMOS transistor N7 of the domino read circuit 160. The NMOS transistor N7 has a source connected to the second power supply VSS and a drain connected to a read global bitline RGDLN. The domino read circuit 160 includes a PMOS transistor P4 which has a source connected to the first power supply VCS, a gate connected to a global reset signal GBLRSTN, and a drain connected to the read global bitline RGDLN.

The latch 180 receives the read global bitline RGDLN and outputs an output QA based on the QSTROBE_A signal. The latch circuit 190 includes latches 200, 210, where the latch 200 also receives the read global bitline RGDLN and outputs a latch output signal based on the QSTROBE_B signal. The latch 210 receives the latch output signal and outputs an output QB based on a clock signal PIPECLK. The transistors P1, P2, N1, N2, N3, and N4 comprise a write port of the memory circuit 100. The NMOS transistors N5 and N6 comprise a read port of the memory circuit 100.

In operation, the high performance characteristics of the domino read circuit 160 enables two successive read operations (i.e., double pump operations) in one clock cycle. The read bitline RBL is driven by the PMOS transistor P3 (i.e., pull up device) which has a gate controlled by the pull up signal PULN. The drain of the PMOS transistor P3 couples to the input of the inverter 170 which outputs the inverter output signal. The read global bitline RGDLN is driven by the PMOS transistor P4 (i.e., pull up device) and the NMOS transistor N7 (i.e., pull down device). The gate of the PMOS transistor P4 is controlled by the global reset signal GBLRSTN, while the gate of the NMOS transistor N7 is controlled by the inverter output signal. The read global bitline RGDLN is the input signal for both the latches 180 and 200. The enable signal for the latch 180 is the QSTROBE_A signal, while the latches 200, 210 are enabled by the QSTROBE_B signal and the PIPECLK signal. The output of the latch 180 is QA and the output of the latch 210 is QB. The memory circuit 100 has flexibility in using a flow-through mode or a pipeline mode for read operations, which depend on different applications and design specifications. Further, the memory circuit 100 of FIG. 1A doubles the bandwidth and data throughput in comparison to conventional 1R1W memory circuits.

As further understood, in operation, in the 8T bitcell 110, the gates of transistors N1 and P1 are coupled together and controlled by the NT node, while their drains are also tied together at the NC node. Further, the gates of transistors N2 and P2 are coupled together and controlled by the NC node, while their drains are tied together at the NT node. The NC node is coupled to the complement bitline BLC via the NMOS transistor N3, which is controlled by the write wordline WL. The read bitline RBL is driven down by the NMOS transistor N6 (i.e., a pull down device) and the NMOS transistor N5 (i.e., a pass gate device). Further, a high signal on the node NT turns the NMOS transistor N6 on and drives the read bitline RBL to ground when the read wordline RWL is high.

Figure 1B:
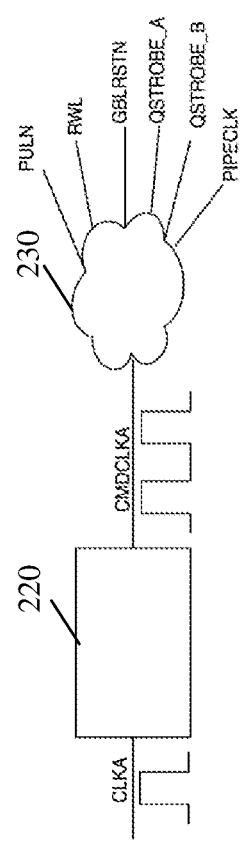
FIG. 1B shows a double pumped timer control which generates two successive read pulses in one cycle in the high performance (2R1W) memory circuit shown in FIG. 1A, in accordance with aspects of the present disclosure.

FIG. 1B shows a double pumped timer control which generates two successive read pulses in one cycle in the high performance 2R1W memory circuit shown in FIG. 1A, in accordance with aspects of the present disclosure. In the double pumped timer control path, the clock signal CLKA is input to a double pump timer 220. The double pump timer 220 outputs a CMDCLKA signal to logic 230. The logic 230 receives the CMDCLKA signal and outputs the pull up signal PULN, the read wordline RWL, the QSTROBE_A signal, the QSTROBE_B signal, and the clock signal PIPE-CLK. In embodiments, the two read ports can be non-synchronized. In further embodiments, the logic 230 can use a clock synchronizer.

The double pump timer 220 is designed to provide the controls necessary to execute two read operations (i.e., double pump operations) within one clock cycle. In an example of the double pump timer 220, the double pump timer 220 will generate a first wordline pulse width of 120 picoseconds, the necessary restore timings via the pull up signal PULN and the global reset signal GBLRSTN, a second 120 picoseconds wordline pulse, and the associated synchronized latch controls (Qstrobe, etc.) The 120 picosecond read wordline pulse is designed to account for a six sigma slow bitcell. For 7 nm technology, for example, the throughput can be 512 Gigabytes (GB)/sec with a 1.6 Gigahertz (GHz) system frequency. Further, the throughput can be 896 GB/sec with a 1.4 GHz system frequency.

Figure 1C:
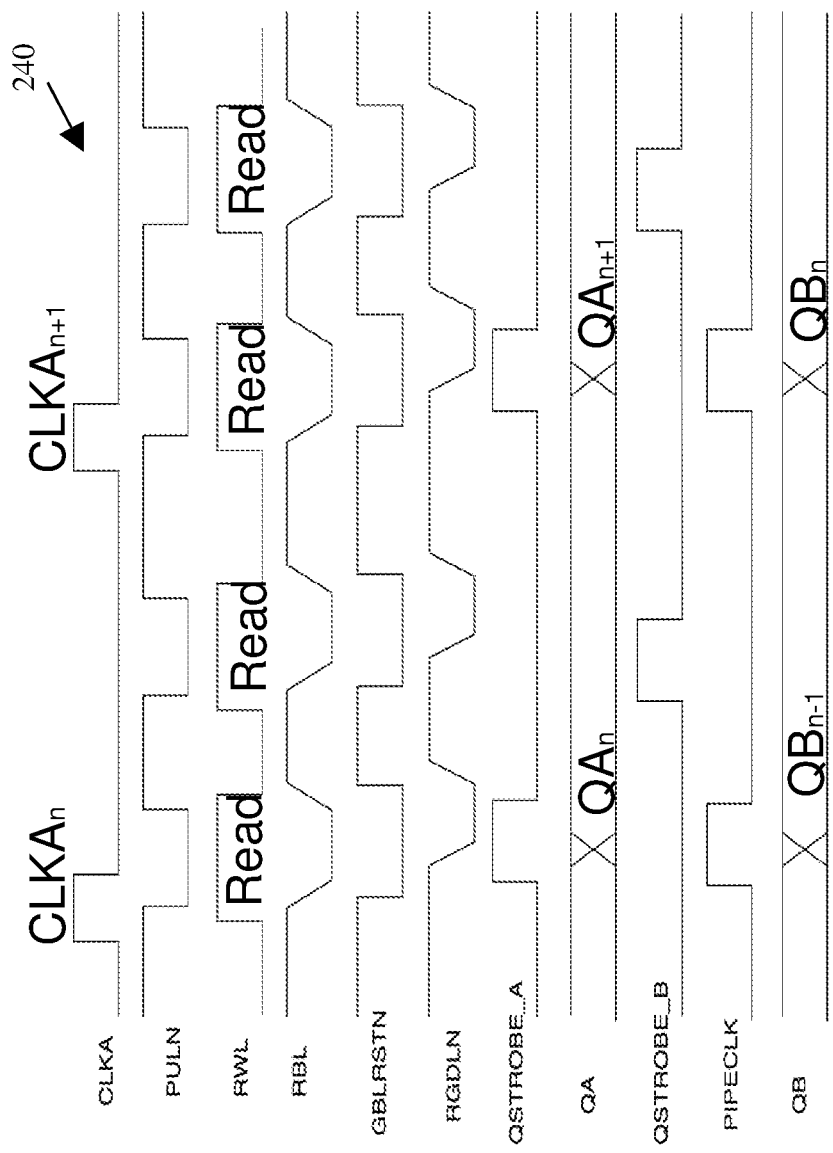
FIG. 1C shows a timing graph of a single read port which has two successive read operations in the high performance (2R1W) memory circuit shown in FIG. 1A, in accordance with aspects of the present disclosure.

FIG. 1C shows a timing graph 240 of the 8T with 2R1W port bitcell in a high performance memory circuit shown in FIG. 1A, in accordance with aspects of the present disclosure. In particular, FIG. 1C shows two successive read operations in one clock cycle for the first read in flow-through mode and second read in pipeline mode. During a pre-charge phase, the pull up signal PULN is kept at a low value and the read bitline RBL is pre-charged to a high value, while the global reset signal GBLRSTN is kept at the low value and the read global bitline RGDLN is pre-charged to the high value. Therefore, when the clock signal CLKAn arrives, a double pump time controlled logic of the memory circuit 100 generates two successive read wordline RWL, pull up signal PULN, and global reset signal GBLRSTN pulses. Specifically, when a first read wordline RWL arrives, both the pull up signal PULN and the global reset signal GBLRSTN go to a high value.

Further, when reading a "1" at the NT node, the NMOS transistor N6 (i.e., a pull down device) is ON. The read bitline RBL is at a low value, so the inverter output signal will be at a high value. The NMOS transistor N7 will be ON and the read global bitline RGDLN goes to a low value.

In contrast, when reading a "0" at the NT node, the read bitline RBL becomes floating at the precharged level "1", so the inverter output signal will stay at the low value. The NMOS transistor N7 will be OFF and the read global bitline RGDLN is also floating at the precharged level "1".

In FIG. 1C, the first read operation of CLKAn period shows read one operation. When the QSTROBE_A signal arrives, the first read data will be latched in the latch 180 and output QAn from a current read operation at output QA. When the PIPECLK signal arrives, the latch 210 will open and QBn−1 from a previous read cycle will arrive at the output QB. When the first read wordline RWL shuts off, the pull up signal PULN and the global reset signal GBLRSTN go to a low value. The read bitline RBL and the read global bitline RGDLN get pre-charged again to get ready for the second read operation in the current cycle. The second read operation is similar to the first read operation.

FIG. 1C shows the read "0" scenario. When the second read wordline RWL arrives, the read bitline RBL and the read global bitline RGDLN remain at the high level. However, the QSTROBE_B signal is ON (i.e., at a high level) and the second data will be latched in the latch 200 and will arrive at output QB in the next cycle (i.e., when the PIPECLK signal goes to a high level). Therefore, in FIGS. 1A-1C, there are two read outputs QAn and QBn−1 in one clock cycle, so the IO bandwidth and data throughput are doubled.

Figures 2A, 2B:
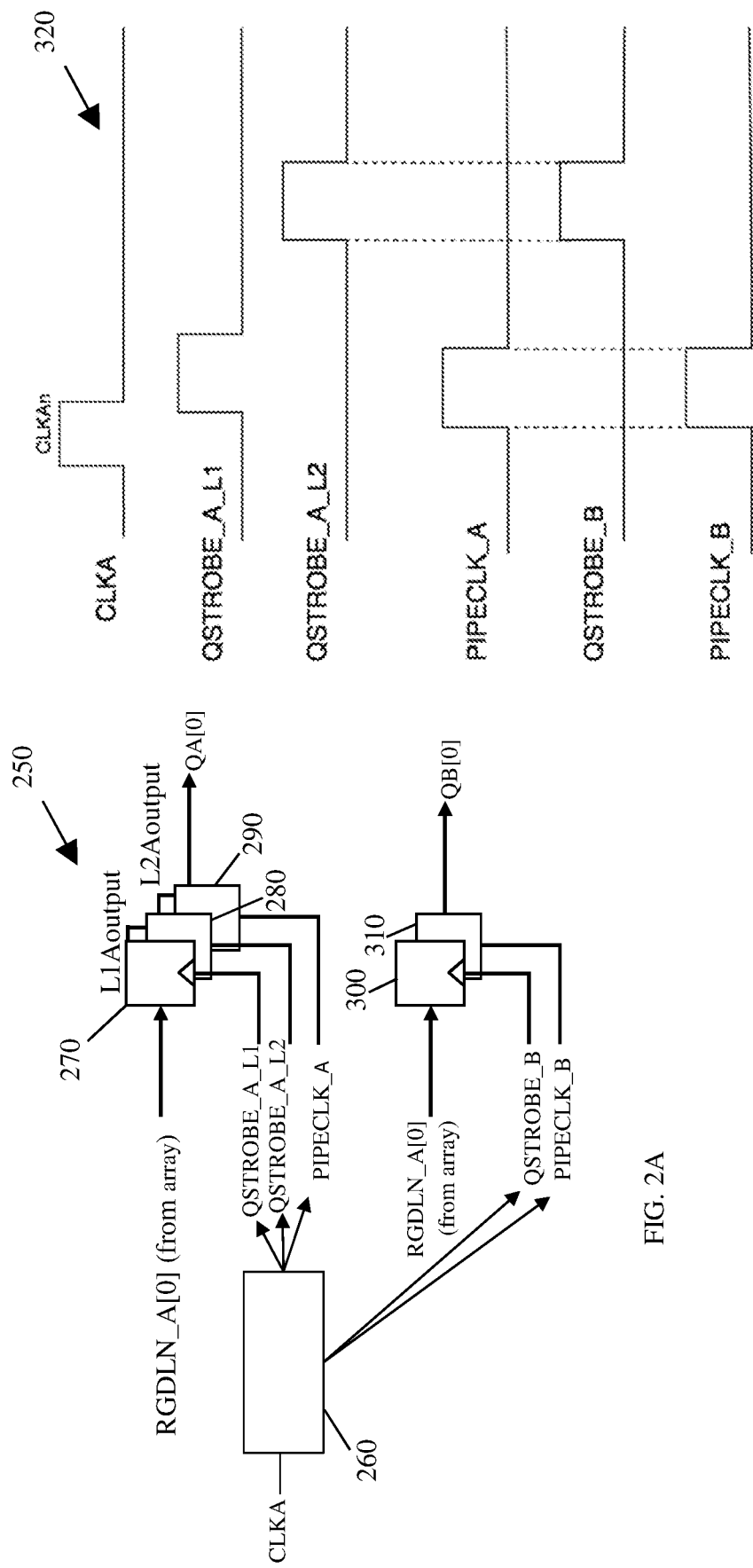
FIG. 2A shows a clock synchronizer which synchronizes an output latch of two read ports in the high performance (2R1W) memory circuit shown in FIG. 1, in accordance with aspects of the present disclosure.
FIG. 2B shows a timing graph of the clock synchronizer for the output latch in a high performance (2R1W) memory circuit shown in FIG. 2A, in accordance with aspects of the present disclosure.

FIG. 2A shows a clock synchronizer for the 8T bitcell based 2R1W high performance memory circuit shown in FIG. 1, in accordance with aspects of the present disclosure. In FIG. 2A, the clock synchronizer circuit 250 includes a clock synchronizer 260 which receives the clock signal CLKA and outputs the QSTROBE_A_L1 signal, the QSTROBE_A_L2 signal, the PIPECLK_A signal, the QSTROBE_B signal, and the PIPECLK_B signal. As shown in FIG. 2A, a latch 270 receives a RGDLN_A[0] (from an array of the read global bitline RGDLN) and outputs a L1Aoutput signal based on the QSTROBE_A_L1 signal. A latch 280 receives the L1Aoutput signal from the latch 270 and outputs a L2Aoutput signal based on the QSTROBE_A_L2 signal. A latch 290 receives the L2Aoutput signal from the latch 280 and outputs QA[0] based on the PIPE-CLK_A signal. A latch 300 also receives the RGDLN_A[0] (from the array of the read global bitline RGDLN) and outputs a L1Boutput signal based on the QSTROBE_B signal. A latch 310 receives the L1Boutput signal from the latch 300 and outputs a QB[0] based on the PIPECLK_B signal.

FIG. 2B shows a timing graph 320 of the clock synchronizer for the 2R1W high performance memory circuit shown in FIG. 2A, in accordance with aspects of the present disclosure. In FIG. 2B, when the clock signal CLKAn arrives, in the flow-through mode, the QSTROBE_A_L2 and QSTROBE_B are output at the same time to enable synchronization of the output signals QA[0] and QB[0]. Therefore, using the clock synchronizer circuit 250, the internal read timing is synchronized for the two read ports (i.e., Port A and Port B) to enable same or similar read access time in the flow-through mode.

In FIG. 2B, in the pipeline mode, the PIPECLK_A signal and the PIPECLK_B signal are output at the same time to enable synchronization of the output signals QA[0] and QB[0]. Therefore, using the clock synchronizer circuit 250, the internal read timing is synchronized for the two read ports (i.e., Port A and Port B) to enable similar read access time in the pipeline mode.

Figure 3A:
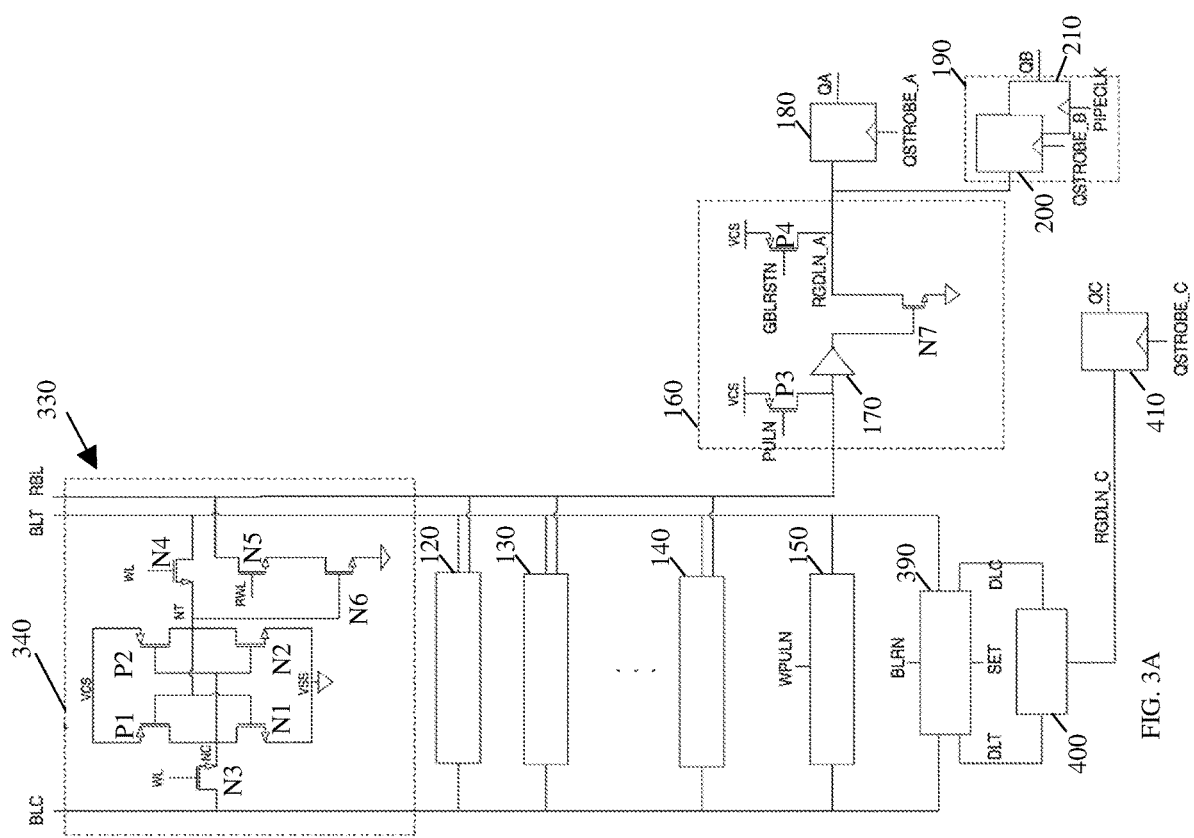
FIG. 3A shows an overview of a high performance (3R1W) memory circuit with an eight transistor (8T) bitcell with three read ports and one write port in accordance with aspects of the present disclosure.

FIG. 3A shows an overview of a high performance (3R1W) memory circuit with an eight transistor (8T) bitcell with three read ports and one write port in accordance with aspects of the present disclosure. The memory circuit 330 has flexibility in using a flow-through mode or a pipeline mode for read operations, which depend on different applications and design specifications. Further, the memory circuit 330 triples the bandwidth and data throughput in comparison to conventional 1R1W memory circuits.

The memory circuit 330 of FIG. 3A is similar to the memory circuit 100 of FIG. 1A, with the exception of an additional read port comprising a sense amplifier 390 and latches 400, 410. An additional double pump timer (i.e., a double pump timer B 500 in FIG. 3B) is added to generate the clocking signals for a read operation followed by a write operation, including the write wordline WL and the write driver pull up signal WPULN with two successive pulses in one clock cycle. The true bitline BLT and the complement bitline BLC are write bitlines which connect to a sense amplifier 390.

In embodiments, the sense amplifier 390 receives a bitline restore signal BLRN, a set signal SET, the true bitline BLT, and the complement bitline BLC, and outputs a true data line DLT and a complement data line DLC to the latch 400. The latch 400 receives the true data line DLT and the complement data line DLC and outputs a read C global bitline RGDLN_C to a latch 410. The latch 410 receives the read C global bitline RGDLN_C and outputs an output signal QC based on the QSTROBE_C signal.

In operation, the set signal SET is used to activate the sense amplifier 390 for sensing operations. The domino read circuit 160 (i.e., double pump domino logic) enables two successive read operations in one clock cycle. The read A global bitline RGDLN_A is the input signal for both the latches 180 and 200. The enable signal for the latch 180 is the QSTROBE_A signal, while the latches 200, 210 are enabled by the QSTROBE_B signal and the PIPECLK signal. The output of the latch 180 is QA and the output of the latch 210 is QB.

Figure 3B:
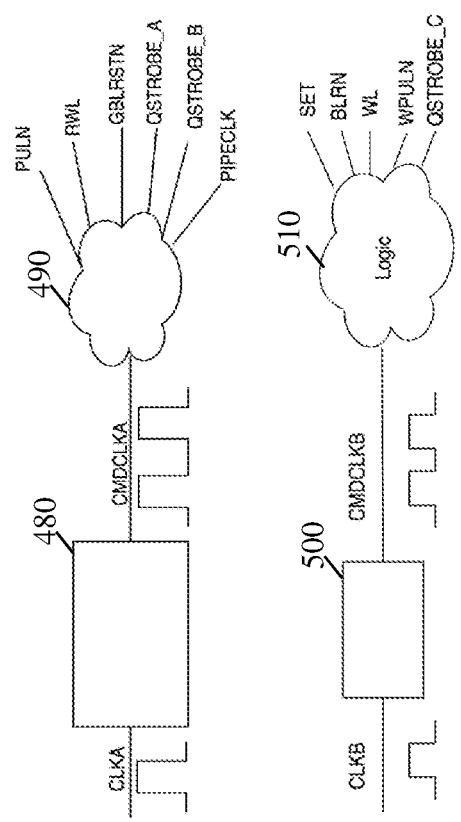
FIG. 3B shows the high performance (3R1W) memory circuit shown in FIG. 3A with a double pumped timer control which generates two successive read pulses in one clock cycle and a read pulse followed by write pulses in one clock cycle, in accordance with aspects of the present disclosure.

FIG. 3B shows a high performance (3R1W) memory circuit in FIG. 3A with a double pumped time control path of the bitcell. In the double pumped time control path, the clock signal CLKA signal is input to a double pump timer A 480. The double pump timer A 480 outputs a CMDCLKA signal to logic 490. The logic 490 receives the CMDCLKA signal and outputs the pull up signal PULN, the read wordline RWL, the global reset signal GBLRSTN, the QSTROBE_A signal, the QSTROBE_B signal, and the clock signal PIPECLK.

The clock signal CLKB signal is input to a double pump timer B 500. In an embodiment, the clock signals CLKA and CLKB can be the same signal or tied together. In another embodiment, clock signal CLKA is independent and runs asynchronously from clock signal CLKB. The double pump timer B 500 outputs a CMDCLKB signal to logic 510. The logic 510 receives the CMDCLKB signal and outputs the set signal SET, the bitline restore signal BLRN, the write wordline WL, the write driver pull signal WPULN, and the QSTROBE_C signal.

In embodiments, the double pump timer A 480 and the double pump timer B 500 can run asynchronously from each other such that the outputs QA and QB are controlled by the clock signal CLKA and the output QC is controlled by the clock signal CLKB. In an embodiment, the clock signal CLKA can run at a different frequency than CLKB. Therefore, the outputs QA and QB can be referenced off of different clock edges, when run in flow-through mode, but are still synchronous with respect to each other.

In one non-limiting illustrative example of the double pumped timer control path, the double pump cycle can include the wordline WL to the set signal SET time of 150 picoseconds, which provides enough amplification time to yield the memory The wordline WL separation is about 150 picoseconds, which guarantees that the either the true bitline (BLT) or complement bitline (BLC) fall to the ground level before the write wordline WL. The wordline WL write pulse width is about 180 picoseconds, which guarantees an adequate write margin for yield For 7 nm technology, as an example, the throughput can be 614 Gigabytes (GB)/sec with a 1.28 Gigahertz (GHz) system frequency. Further, the throughput can be 1.075 Terabytes (TB)/sec with a 1.12 GHz system frequency.

Figure 3C:
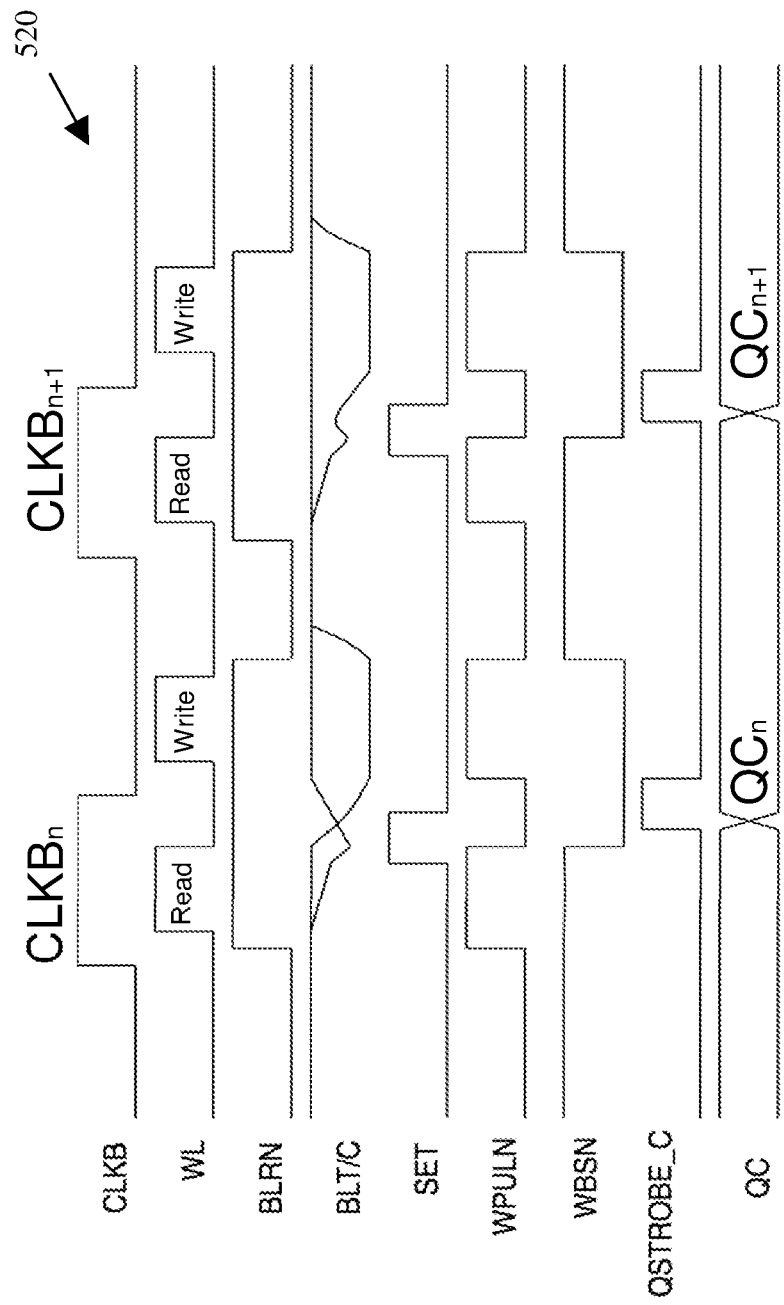
FIG. 3C shows a timing graph of a differential bitline port which has a read operation followed by a write operation in the high performance 3R1W memory circuit shown in FIG. 3A, in accordance with aspects of the present disclosure.

FIG. 3C shows a timing graph 520 of the 8T bitcell with 3R1W port in a high performance memory circuit shown in FIG. 3A, in accordance with aspects of the present disclosure. In particular, FIG. 3C shows a timing sequence of a double pumped read-followed-by-write operation completed in one cycle. During a pre-charge phase, the bitline reset signal BLRN and the write driver pull up signal WPULN stays low and the true bitline BLT and complement bitline BLC are pre-charged to a high value. Then, when the clock signal CLKB arrives, a double pump timer B controlled logic generates two successive bitline reset signals BLRN and the write wordline WL pulses, which are changed to a high value. The true bitline BLT or complement bitline BLC then starts to discharge, depending on the read data.

When a differential voltage between the true bitline BLT and the complement bitline BLC is sufficient (i.e., at a large enough differential) for the sense amplifier to evaluate, the write wordline WL turns off and the set signal SET turns on. The sense amplifier then begins to amplify the differential between the true data line DLT and complement data line DLC. The output signal of the sense amplifier gets latched and output to the read C global bitline RGDLN_C. When the QBSTROBE_C signal arrives, the read data is output to QC.

After an intra cycle separation time, a write operation starts. In this scenario, the write bitswitch signal WBSN and the write driver pull up signal WPULN change to a low value and the write driver 150 begins to pre-charge or discharge the true bitline BLT and the complement bitline BLC, depending on the write data. When the write wordline WL turns on, the true bitline BLT and the complement bitline BLC begins to drive the NT node and the NC node to write the bitcell. After completing the write operation, the write wordline WL turns off and the write bitswitch signal WBSN changes to a high value. The bitline reset signal BLRN and the write driver pull up signal WPULN changes to a low value to pre-charge the true bitline BLT and the complement BLC to a rail voltage to get ready for a next cycle.

Figures 4A, 4B:
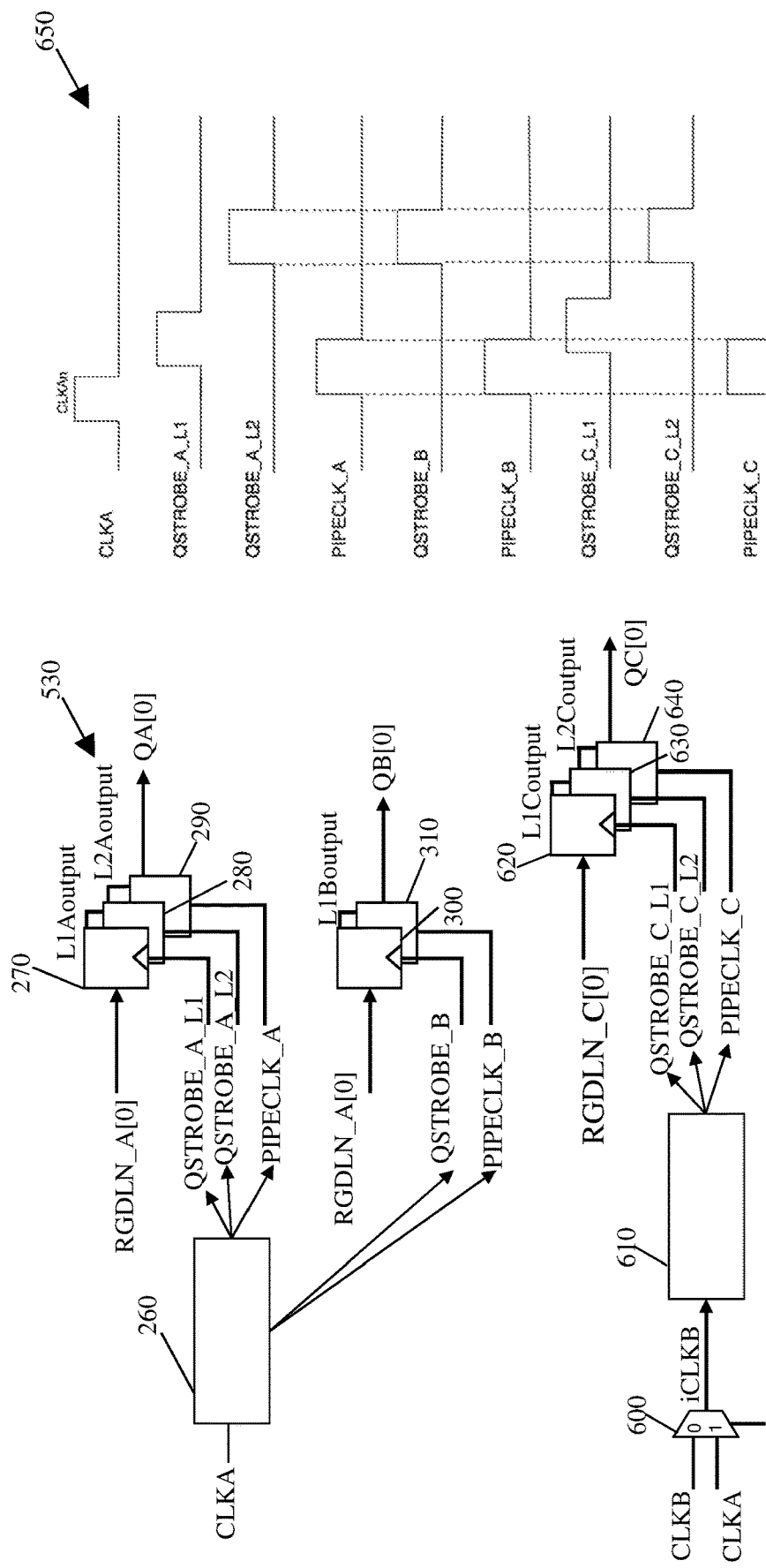
FIG. 4A shows two clock synchronizers which provide an option to synchronize external clock signals CLKA and CLKB and also internal read timing for Port A, Port B, and Port C to enable similar read access time in both flow-through mode and pipeline mode in the high performance (3R1W) memory circuit shown in FIG. 3A, in accordance with aspects of the present disclosure.
FIG. 4B shows a timing graph of the clock synchronizer for the output latches in a high performance (3R1W) memory circuit shown in FIG. 4A, in accordance with aspects of the present disclosure.

FIG. 4A shows two clock synchronizers which provide an option to synchronize external clock signals CLKA and CLKB and also internal read timing for Port A, Port B, and Port C to enable similar read access time in both flow-through mode and pipeline mode in the high performance 3R1W memory circuit shown in FIG. 3A, in accordance with aspects of the present disclosure. In FIG. 4A, a clock synchronizer circuit 530 includes the clock synchronizer 260 which receives the clock signal CLKA and outputs the QSTROBE_A_L1 signal, the QSTROBE_A_L2 signal, the PIPECLK_A signal, the QSTROBE_B signal, and the PIPECLK_B signal. As shown in FIG. 4A, the latch 270 receives a RGDLN_A[0] (from an array of the read A global bitline RGDLN_A) and outputs the L1Aoutput signal based on the QSTROBE_A_L1 signal. The latch 280 receives the L1Aoutput signal from the latch 270 and outputs a L2Aoutput signal based on the QSTROBE_A_L2 signal. The latch 290 receives the L2Aoutput signal from the latch 280 and outputs QA[0] based on the PIPECLK_A signal.

In the clock synchronizer circuit 530, the latch 300 also receives the RGDLN_A[0] (from the array of the read A global bitline RGDLN_A) and outputs a L1Boutput signal based on the QSTROBE_B signal. The latch 310 receives the L1Boutput signal from the latch 300 and outputs a QB[0] based on the PIPECLK_B signal. The clock synchronizer circuit 530 also includes an optional 600 multiplexer which receives the clock signals CLKA, CLKB and outputs an iCLKB signal based on a sync signal. In an embodiment, the multiplexer 600 can be replaced with clock pins that can be shorted together. A clock synchronizer 610 of the clock synchronizer circuit 530 receives the iCLKB signal and outputs the QSTROBE_C_L1 signal, the QSTROBE_C_L2 signal, and the PIPECLK_C signal. A latch 620 receives the RGDLN_C[0] (from the array of the read C global bitline RGDLN_C) and outputs a L1Coutput signal based on the QSTROBE_C_L1 signal. A latch 630 receives the L1Coutput signal from the latch 620 and outputs a L2Coutput signal based on the QSTROBE_C_L2 signal. A latch 640 receives the L2Coutput signal and outputs a QC[0] based on the PIPECLK_C signal.

FIG. 4B shows a timing graph 650 of the clock synchronizer for the output latches in a high performance 3R1W memory circuit shown in FIG. 4A, in accordance with aspects of the present disclosure. In FIG. 4B, when the clock signal CLKA arrives, in the flow-through mode, the QSTROBE_A_L1 signal and the QSTROBE_C_L1 signal are output. Then, the QSTROBE_A_L2 signal, the QSTROBE_B signal, and the QSTROBE_C_L2 signal are output at the same time to enable synchronization of the output signals QA[0], QB[0], and QC[0]. Therefore, using the clock synchronizer circuit 530, the internal read timing is synchronized for the three read ports (i.e., Port A, Port B, and Port C) to enable same or similar read access time in the flow-through mode.

In FIG. 4B, in the pipeline mode, the PIPECLK_A signal, the PIPECLK_B signal, and the PIPECLK_C signal are output at the same time to enable synchronization of the output signals QA[0], QB[0], and QC[0]. Therefore, using the clock synchronizer circuit 530, the internal read timing is synchronized for the three read ports (i.e., Port A, Port B, and Port C) to enable same or similar read access time in the pipeline mode.

The circuit and the method for an eight transistor cell based high performance two or three read ports (2R/3R) one write port (1W) memory circuit of the present disclosure can be manufactured in a number of ways using a number of different tools. In general, though, the methodologies and tools are used to form structures with dimensions in the micrometer and nanometer scale. The methodologies, i.e., technologies, employed to manufacture the circuit and the method for an eight cell based high performance two or three read ports (2R/3R) one write port (1W) memory circuit of the present disclosure has been adopted from integrated circuit (IC) technology. For example, the structures are built on wafers and are realized in films of material patterned by photolithographic processes on the top of a wafer. In particular, the fabrication of the circuit and the method for an eight cell based high performance two or three read ports (2R/3R) one write port (1W) memory circuit uses three basic building blocks: (i) deposition of thin films of material on a substrate, (ii) applying a patterned mask on top of the films by photolithographic imaging, and (iii) etching the films selectively to the mask.

The method(s) as described above is used in the fabrication of integrated circuit chips. The resulting integrated circuit chips can be distributed by the fabricator in raw wafer form (that is, as a single wafer that has multiple unpackaged chips), as a bare die, or in a packaged form. In the latter case the chip is mounted in a single chip package (such as a plastic carrier, with leads that are affixed to a motherboard or other higher level carrier) or in a multichip package (such as a ceramic carrier that has either or both surface interconnections or buried interconnections). In any case the chip is then integrated with other chips, discrete circuit elements, and/or other signal processing devices as part of either (a) an intermediate product, such as a motherboard, or (b) an end product. The end product can be any product that includes integrated circuit chips, ranging from toys and other low-end applications to advanced computer products having a display, a keyboard or other input device, and a central processor. Further, the circuit and the method for logic-in-memory computations of the present disclosure can have wide applicability in high throughput processors for machine learning and artificial intelligence.

The descriptions of the various embodiments of the present disclosure have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

What is claimed:

1. A memory circuit comprising:
   a memory bitcell comprising a single ended read port and configured to store a bit of data;
   a timer circuit configured to receive a clock signal and generate two successive pulses during a single cycle of the clock signal and, based on the two successive pulses, generate first control signals to enable asynchronous reading of the single ended read port during the single cycle of the clock signal; and
   a read circuit connected to the single ended read port of the memory bitcell the read circuit being configured to, based on the first control signals, perform two successive reads of the single ended read port during the single cycle of the clock signal and output respective states of the memory bitcell read during the two successive reads of the single ended read port.

2. The memory circuit of claim 1, wherein the memory bitcell comprises eight transistors.

3. The memory circuit of claim 2, wherein the memory bitcell comprises:
   a first N-type metal-oxide-semiconductor transistor comprising
     a drain connected to a read bitline,
     a gate connected to a read wordline, and
     a source; and
   a second N-type metal-oxide-semiconductor transistor comprising
     a drain connected to the source,
     a gate connected to a bit-cell storage node, and
     a source connected to ground reference terminal.

4. The memory circuit of claim 1, wherein:
   the memory bitcell comprises a write port; and
   the write port comprises a first P-type metal-oxide-semiconductor transistor, a second P-type metal-oxide-semiconductor transistor, a first N-type metal-oxide-semiconductor transistor, a second N-type metal-oxidesemiconductor transistor, a third N-type metal-oxide-semiconductor transistor, and a fourth N-type metal-oxide-semiconductor transistor.

5. The memory circuit of claim 4, wherein:
the first P-type metal-oxide-semiconductor transistor comprises
a source connected to a power supply,
a gate connected to a gate of the N-type metal-oxide-semiconductor transistor, and
a drain connected to a drain of the first write-NMOS-N-type metal-oxide-semiconductor transistor; and
the second P-type metal-oxide-semiconductor transistor comprises
a source connected to the power supply,
a gate connected to a gate of the second N-type metal-oxide-semiconductor transistor, and
a drain connected to a drain of the second N-type metal-oxide-semiconductor transistor.

6. The memory circuit of claim 5, wherein:
the first N-type metal-oxide-semiconductor transistor and the second N-type metal-oxide-semiconductor transistor each have a source connected to a ground reference terminal;
the third N-type metal-oxide-semiconductor transistor comprises
a drain connected to a complement bitline,
a gate connected to a wordline, and
a source connected to a first bitcell storage node; and
the fourth N-type metal-oxide-semiconductor transistor comprises
a source connected to a second bitcell storage node,
a gate connected to the wordline, and
a drain connected to a true bitline.

7. The memory circuit of claim 1, wherein the read circuit comprises a first P-type metal-oxide-semiconductor transistor, an inverter, a second P-type metal-oxide-semiconductor transistor, and a N-type metal-oxide-semiconductor transistor.

8. The memory circuit of claim 7, wherein:
the first P-type metal-oxide-semiconductor transistor comprises
a source connected to a power supply,
a gate connected to a pull up signal, and
a drain connected to an input of the inverter;
the N-type metal-oxide-semiconductor transistor comprises
a gate connected to an output of the inverter,
a drain connected to a read global bitline, and
a source connected to ground; and
the second P-type metal-oxide-semiconductor transistor comprises
a source connected to the power supply,
a gate connected to a global reset signal, and
a drain connected to the read global bitline.

9. The memory circuit of claim 1, wherein the timer circuit comprises:
a first latch configured to, during the single cycle of the clock signal, store output data read during the first one of the two successive reads;
a second latch configured to, during the single cycle of the clock signal and while operating in a flow-through mode, store output data read during the second one of the two successive reads; and
a third latch configured to, during the single cycle of the clock signal and while operating in a pipeline mode, store output data read during the second one of the two successive reads.

10. The memory circuit of claim 1, further comprising a clock synchronizer circuit connected to an output of the read circuit and configured to synchronize read timing for two read-output ports, wherein the two output ports output states of the memory bitcell read during two successive single cycles of the clock signal.

11. The memory circuit of claim 1, further comprising a pre-charging circuit configured to pre-charge an output of the read circuit after the first one of the two successive reads and before the second one of the two successive reads.

12. The memory circuit of claim 1, further comprising a plurality of latches configured to concurrently output:
a first state of the single ended read port, which is indicative of a state of a storage node of the memory bitcell, read during the single cycle of the clock signal, wherein the single cycle of the clock signal is a current clock cycle; and
a second state of the single ended read port, which is indicative of the state of the storage node of the memo bitcell, read during a cycle of the clock signal prior to the current clock cycle.

13. The memory circuit of claim 1, further comprising a plurality of latches comprising respective output ports and configured to, based on second control signals and during the single cycle of the clock signal, output bits at the respective output ports indicative of the respective states of the memory bitcell read during the two successive reads of the single ended read port,
wherein the timer circuit is configured to generate the second control signals based on the clock signal.

14. The memory circuit of claim 1, wherein:
the read circuit comprises a plurality of transistors; and
the plurality of transistors are configured to, based on the first control signals, read the memory bitcell twice during the single cycle of the clock signal.

15. The memory circuit of claim 1, wherein:
the memory bitcell comprises a multi-transistor write port;
the timer circuit is configured to generate second control signals based on the two successive pulses; and
the multi-transistor write port is configured to, based on the second control signals, output bits of data corresponding respectively to the two successive pulses.

16. The memory circuit of claim 1, further comprising a plurality of latches, wherein:
the timer circuit is configured to generate second control signals based on the two successive pulses; and
the plurality of latches are configured to, based on the second control signals, concurrently output multiple bits of data at respective output ports; and
the multiple bits of data are read from the single ended read port during the single cycle of the clock signal and based on the two successive pulses.

17. A memory circuit comprising:
a memory bitcell comprising a single ended read port and a differential write port and configured to store a bit of data;
a first timer circuit configured to receive a clock signal and generate two successive read pulses during a single cycle of the clock signal to enable two successive reads of the single ended read port during the single cycle of the clock signal;
a second timer circuit configured to generate two timing pulses during the single cycle of the clock signal to enable a read operation of the memory bitcell followed by a write operation of the memory bitcell during the single cycle of the clock signal; and a read circuit connected to the single ended read port and configured to perform the two successive reads of the read port during the single cycle of the clock signal and output respective states of the memory bitcell read during the two successive reads of the single ended read port.

18. The memory circuit of claim 17, further comprising:
a first latch comprising a first read output port;
a second latch comprising a second read output port, wherein the first latch and the second latch are connected to the read circuit;
a third latch comprising a third read output port;
a differential sense amplifier connected to the third read output port and configured to sense a differential voltage of the differential write port of the memory bitcell during the read operation;
a first clock synchronizer connected to an output of the read circuit; and
a second clock synchronizer connected to an output of the differential sense amplifier and configured to synchronize read timing for the first read output port, the second read output port and the third read output port, wherein the single ended read port comprises a first read N-type metal-oxide-semiconductor transistor and a second N-type metal-oxide-semiconductor transistor.

19. The memory circuit of claim 18, wherein;
the first timer circuit is configured to enable the read circuit to perform the two successive reads of the single ended read port during the single cycle of the clock signal based on the generation of the two successive read pulses;
the first timer circuit comprises the first latch;
the first latch is configured to store data read during the single cycle of the clock signal;
the second timer circuit comprises the second latch; and
the second latch is configured to receive an input from the differential sense amplifier to store data read during the read operation.

20. The memory circuit of claim 17, wherein a write port of the memory bitcell comprises a first P-type metal-oxide-semiconductor transistor, a second P-type metal-oxide-semiconductor transistor, a first N-type metal-oxide-semiconductor transistor, a second N-type metal-oxide-semiconductor transistor, a third N-type metal-oxide-semiconductor transistor and a fourth N-type metal-oxide-semiconductor transistor.

21. The memory circuit of claim 17, wherein:
the first timer circuit is configured to generate control signals based on the two successive read pulses;
the read circuit comprises a plurality of transistors; and
the plurality of transistors are configured to, based on the control signals, read the memory bitcell twice during the single cycle of the clock signal.

22. The memory circuit of claim 17, wherein an output of the read circuit is pre-charged after the read operation and before a next read operation.

23. The memory circuit of claim 17, wherein the first timer circuit concurrently outputs:
a first state of the single ended read port, which is indicative of a state of a storage node of the memory bitcell, read during the single cycle of the clock signal, wherein the single cycle of the clock signal is a current clock cycle; and
a second state of the single ended read port, which is indicative of the state of the storage node of the memory bitcell, read during a cycle of the clock signal prior to the current clock cycle.

24. The memory circuit of claim 17, further comprising a sense amplifier configured to sense a differential voltage of the differential write port, wherein:
the single ended read port outputs a first voltage indicating the bit of data via a read bitline of the memory bitcell; and
the differential write port outputs the differential voltage indicating another bit of data via a true bitline and a complimentary bitline of the memory bitcell.

25. A method, comprising:
receiving a clock signal;
generating two successive read pulses during a single cycle of the clock signal to enable two successive reads of a single ended read port of a memory bitcell during the single cycle of the clock signal;
generating two timing pulses during the single cycle of the clock signal to enable a read of a differential write port of the memory bitcell followed by a write operation of the differential write port during the single cycle of the clock signal;
latching states of the memory bitcell, read during the two success reads, respectively for a first output port and a second output port;
latching a state of the memory bitcell read during the read of the differential write port for a third output port; and
generating synchronized timing signals to enable a same access time for the first output port, the second output port and the third output port.

* * * * *